(12) United States Patent
Yang (10) Patent No.: US 12,034,014 B2
(45) Date of Patent: Jul. 9, 2024

(54) DISPLAY PANEL, MANUFACTURING METHOD THEREOF, AND DISPLAY DEVICE

(71) Applicants: CHENGDU BOE OPTOELECTRONICS TECHNOLOGY CO., LTD., Sichuan (CN); BOE TECHNOLOGY GROUP CO., LTD., Beijing (CN)

(72) Inventor: Zhongliu Yang, Beijing (CN)

(73) Assignees: CHENGDU BOE OPTOELECTRONICS TECHNOLOGY CO., LTD., Sichuan (CN); BOE TECHNOLOGY GROUP CO., LTD., Beijing (CN)

( * ) Notice: Subject to any disclaimer, the term of this patent is extended or adjusted under 35 U.S.C. 154(b) by 575 days.

(21) Appl. No.: 17/419,812

(22) PCT Filed: Sep. 29, 2020

(86) PCT No.: PCT/CN2020/118821
§ 371 (c)(1),
(2) Date: Jun. 30, 2021

(87) PCT Pub. No.: WO2021/068805
PCT Pub. Date: Apr. 15, 2021

(65) Prior Publication Data
US 2022/0077200 A1 Mar. 10, 2022

(30) Foreign Application Priority Data
Oct. 9, 2019 (CN) .......................... 201910955832.1

(51) Int. Cl.
*H01L 27/12* (2006.01)
*H01L 23/00* (2006.01)

(52) U.S. Cl.
CPC .......... *H01L 27/1248* (2013.01); *H01L 24/02* (2013.01); *H01L 24/05* (2013.01);
(Continued)

(58) Field of Classification Search
CPC ............. H01L 27/1248; H01L 27/1288; H01L 27/124; H01L 24/02; H01L 24/05;
(Continued)

(56) References Cited

U.S. PATENT DOCUMENTS

2016/0225463 A1   8/2016   Yamazaki et al.
2016/0357081 A1   12/2016  Li
(Continued)

FOREIGN PATENT DOCUMENTS

CN   104536207 A   4/2015
CN   107272244 A   10/2017
(Continued)

OTHER PUBLICATIONS

First office action of Chinese application No. 201910955832.1 issued on Dec. 24, 2020.
(Continued)

*Primary Examiner* — Igwe U Anya
(74) *Attorney, Agent, or Firm* — Lippes Mathias LLP (57) ABSTRACT

A display panel includes a base substrate, a bonding pattern, and a planarization layer pattern. The bonding pattern includes one or more conductive blocks. A bonding region is disposed on a surface, distal from the base substrate, of the conductive block. The planarization layer pattern is provided with an opening region and an occlusion region. An orthographic projection of the bonding region onto the base substrate is within an orthographic projection of the opening region onto the base substrate. The planarization layer pattern covers at least part of a side surface of the conductive block.

20 Claims, 5 Drawing Sheets

(52) U.S. Cl.
CPC ........ *H01L 27/1288* (2013.01); *H01L 27/124* (2013.01); *H01L 2224/0221* (2013.01); *H01L 2224/05073* (2013.01); *H01L 2224/05553* (2013.01); *H01L 2224/05559* (2013.01); *H01L 2224/05573* (2013.01)

(58) Field of Classification Search
CPC ... H01L 2224/0221; H01L 2224/05073; H01L 2224/05553; H01L 2224/05559; H01L 2224/05573
USPC .......................................................... 257/72
See application file for complete search history.

(56) References Cited

U.S. PATENT DOCUMENTS

2019/0227362 A1  7/2019  Sun et al.
2021/0366850 A1* 11/2021  Wang ................... H10K 59/873

FOREIGN PATENT DOCUMENTS

| | | |
|---|---|---|
| CN | 108550588 A | 9/2018 |
| CN | 110676217 A | 1/2020 |
| IN | 107579040 A | 1/2018 |

OTHER PUBLICATIONS

Second office action of Chinese application No. 201910955832.1 issued on Jun. 1, 2021.
Notification to grant patent right for invention of Chinese application No. 201910955832.1 issued on Aug. 31, 2021.

* cited by examiner

```
┌─────────────────────────────────────────────────────────────┐
│ Forming a bonding pattern on a base substrate, wherein the  │─── 901
│ bonding pattern includes one or more conductive blocks,     │
│ wherein a bonding region is provided on a surface, distal   │
│ from the base substrate, of each conductive block           │
└─────────────────────────────────────────────────────────────┘
                              │
                              ▼
┌─────────────────────────────────────────────────────────────┐
│ Forming a planarization layer on the base substrate where   │─── 902
│ the bonding pattern is formed                               │
└─────────────────────────────────────────────────────────────┘
                              │
                              ▼
┌─────────────────────────────────────────────────────────────┐
│ Processing the planarization layer into a planarization     │─── 903
│ layer pattern                                               │
└─────────────────────────────────────────────────────────────┘
```

DISPLAY PANEL, MANUFACTURING METHOD THEREOF, AND DISPLAY DEVICE

CROSS-REFERENCE TO RELATED APPLICATIONS

This application is a 371 of PCT Application No. PCT/CN2020/118821, filed on Sep. 29, 2020, which claims priority to Chinese Patent Application No. 201910955832.1, filed on Oct. 9, 2019 and entitled "DISPLAY PANEL, MANUFACTURING METHOD THEREOF AND DISPLAY DEVICE," the disclosure of which is herein incorporated by reference in its entirety.

TECHNICAL FIELD

The present disclosure relates to the field of display technologies, and in particular, relates to a display panel, a manufacturing method thereof, and a display device.

BACKGROUND

A bonding structure is a structure for connecting a circuit board and a display panel. The bonding structure may transmit a data signal received from the circuit board to the display panel, to drive the display panel to display.

The bonding structure connects the circuit board and the display panel by a bonding pattern disposed on the bonding structure. In the related art, for simplification of a manufacturing process of a display panel, a bonding pattern on a bonding structure and a source/drain metal pattern are disposed in a same layer. In the process of forming an anode on the source/drain metal pattern by a patterning process, a planarization layer (PLN) is first covered on the display panel where the source/drain metal pattern and the bonding pattern are formed. The planarization layer covering the bonding pattern is then removed, and the planarization layer covering the source/drain metal pattern in a display region of the display panel is retained. The anode is then formed on the source/drain metal pattern in the display region by the patterning process.

SUMMARY

Embodiments of the present disclosure provide a display panel, a manufacturing method thereof, and a display device. The technical solutions are as follows.

According to an aspect of the present disclosure, a display panel is provided. The display panel includes a base substrate, a bonding pattern, and a planarization layer pattern.

The bonding pattern is disposed on the base substrate. The bonding pattern includes one or more conductive blocks. A bonding region is disposed on a surface, distal from the base substrate, of the conductive block.

The planarization layer pattern is provided with an opening region and an occlusion portion in a plane parallel to the base substrate. An orthographic projection of the bonding region onto the base substrate is within an orthographic projection of the opening region onto the base substrate.

The planarization layer pattern covers at least part of a side surface of the conductive block. The side surface is a surface, other than a surface proximal to the base substrate and a surface distal from the base substrate, of the conductive block.

Optionally, the bonding pattern includes a first sub-bonding pattern and a second sub-bonding pattern, wherein the first sub-bonding pattern includes at least one of the one or more conductive blocks; and the display panel includes a first insulating layer, a second insulating layer, and an interlayer dielectric layer, wherein the first insulating layer, the second sub-bonding pattern, the second insulating layer, the interlayer dielectric layer, and the first sub-bonding pattern are sequentially disposed on the base substrate.

Optionally, the conductive block includes a source/drain line.

Optionally, the second sub-bonding pattern includes a gate pattern.

Optionally, the interlayer dielectric layer and the second insulating layer are each provided with a via, and the first sub-bonding pattern is electrically connected to the second sub-bonding pattern by the via.

Optionally, a surface, distal from the base substrate, of the occlusion portion of the planarization layer pattern is flush with a surface, distal from the base substrate, of the bonding pattern.

Optionally, a thickness of the occlusion portion of the planarization layer pattern rangers from 6500 angstroms to 8800 angstroms.

Optionally, the occlusion portion of the planarization layer pattern is provided with at least one groove.

Optionally, a surface, distal from the base substrate, of the occlusion portion of the planarization layer pattern is flush with a surface, distal from the base substrate, of the bonding pattern;
  the bonding pattern includes a first sub-bonding pattern and a second sub-bonding pattern, wherein the first sub-bonding pattern includes at least one of the one or more conductive blocks;
  the display panel includes a first insulating layer, a second insulating layer, and an interlayer dielectric layer, wherein the first insulating layer, the second sub-bonding pattern, the interlayer dielectric layer, and the first sub-bonding pattern are sequentially disposed on the base substrate;
  the conductive block includes a source/drain line;
  the second sub-bonding pattern includes a gate pattern; and
  the interlayer dielectric layer and the second insulating layer are each provided with a via, wherein the first sub-bonding pattern is electrically connected to the second sub-bonding pattern by the via.

According to another aspect of the present disclosure, a manufacturing method of a display panel is provided. The method includes:
  forming a bonding pattern on a base substrate, where the bonding pattern includes one or more conductive blocks, wherein a surface, distal from the base substrate, of each of the one or more conductive blocks is provided with a bonding region;
  forming a planarization layer on the base substrate where the bonding pattern is formed; and
  processing the planarization layer into a planarization layer pattern, wherein the planarization layer pattern is provided with an opening region and an occlusion portion in a plane parallel to the base substrate, an orthographic projection of the bonding region onto the base substrate is within an orthographic projection of the opening region onto the base substrate, and the planarization layer pattern at least covers at least part of a side surface of the conductive block, wherein the side surface is a surface, other than a surface proximal to the base substrate and a surface distal from the base substrate, of the conductive block.

Optionally, a material of the planarization layer includes a photoresist, and processing the planarization layer into a planarization layer pattern includes:
  processing the planarization layer into a planarization layer pattern including at least one groove, wherein the at least one groove is disposed in the occlusion portion of the planarization layer pattern.

Optionally, processing the planarization layer into the planarization layer pattern including the at least one groove includes:
  forming the planarization layer pattern including the at least one groove by exposing and developing the planarization layer using a designated mask as a mask, wherein the designated mask includes a grayscale mask region corresponding to the groove.

Optionally, the designated mask includes a first region and a second region, wherein the first region corresponds to the occlusion portion, and the second region corresponds to the opening region.

Optionally, processing the planarization layer into a planarization layer pattern includes:
  processing the planarization layer into the planarization layer pattern by a grayscale mask process, wherein a surface, distal from the base substrate, of the occlusion portion of the planarization layer pattern is flush with a surface, distal from the base substrate, of the bonding pattern.

Optionally, the bonding pattern includes a first sub-bonding pattern and a second sub-bonding pattern, and forming the bonding pattern on a base substrate includes:
  forming a first insulating layer on the base substrate;
  forming the second sub-bonding pattern on the base substrate where the first insulating layer is formed;
  forming a second insulating layer on the base substrate where the second sub-bonding pattern is formed;
  forming an interlayer dielectric layer on the base substrate where the second insulating layer is formed; and
  forming the first sub-bonding pattern on the base substrate where the interlayer dielectric layer is formed, wherein the first sub-bonding pattern includes at least one of the one or more conductive blocks.

Optionally, before forming the first sub-bonding pattern on the base substrate where the interlayer dielectric layer is formed, the method includes:
  forming a via in each of the interlayer dielectric layer and the second insulating layer; and
  forming the first sub-bonding pattern on the base substrate where the interlayer dielectric layer is formed includes:
  forming the first sub-bonding pattern on the base substrate where the interlayer dielectric layer with the via is formed, wherein the first sub-bonding pattern is connected to the second sub-bonding pattern by the via in the interlayer dielectric layer and the second insulating layer.

Optionally, the conductive block includes a source/drain line, and the second sub-bonding pattern includes a gate pattern.

Optionally, a thickness of the occlusion portion of the planarization layer pattern ranges from 6500 angstroms to 8800 angstroms.

Optionally, a material of the planarization layer includes a photoresist, and processing the planarization layer into a planarization layer pattern includes:
  forming the planarization layer pattern including at least one groove by exposing and developing the planarization layer using a designated mask as a mask, wherein the designated mask includes a grayscale mask region, a first region, and a second region, wherein the grayscale mask region corresponds to the groove, the first region corresponds to the occlusion portion, and the second region corresponds to the opening region; and
  the bonding pattern includes a first sub-bonding pattern and a second sub-bonding pattern, and forming the bonding pattern on the base substrate includes:
  forming a first insulating layer on the base substrate;
  forming the second sub-bonding pattern on the base substrate where the first insulating layer is formed;
  forming a second insulating layer on the base substrate where the second sub-bonding pattern is formed;
  forming an interlayer dielectric layer on the base substrate where the second insulating layer is formed; and
  forming the first sub-bonding pattern on the base substrate where the interlayer dielectric layer is formed, wherein the first sub-bonding pattern includes at least one of the one or more conductive blocks.

According to another aspect of the present disclosure, a display device is provided. The display device includes any display panel as described above.

BRIEF DESCRIPTION OF THE DRAWINGS

For clearer descriptions of the technical solutions in the embodiments of the present disclosure, the following briefly introduces the accompanying drawings required for describing the embodiments. Apparently, the accompanying drawings in the following description show merely some embodiments of the present disclosure, and a person of ordinary skill in the art may still derive other drawings from these accompanying drawings without creative efforts.

DETAILED DESCRIPTION

The embodiments of the present disclosure are described below with reference to the accompanying drawings.

At present, multi-layer metal materials are often used to form a bonding pattern. When etching an anode layer by an etchant, a displacement reaction occurs between an interlayer of the multi-layer metal material exposed from a side surface of the bonding pattern and the etchant.

For example, the multi-layer metal materials are titanium/aluminum/titanium (that is, Ti/Al/Ti) materials. That is, the multi-layer metal materials are three layers of metal materials. The metal material of the intermediate interlayer is aluminum, and the metal material of both the upper and lower layers of the intermediate interlayer is titanium. An anode to be etched may also be made of multi-layer material. For example, the multi-layer material is an indium tin oxide/silver/indium tin oxide (that is, ITO/Ag/ITO) material. That is, the multi-layer material is three layers of material. The material of the intermediate interlayer is silver, and the material of both the upper and lower layers of the intermediate interlayer is indium tin oxide. The anode is etched by a silver (Ag) etchant. The silver etchant contains silver ions. The silver etchant is corrosive to aluminum in the bonding pattern. During corrosion, a displacement reaction occurs between aluminum atoms and the silver ions in the etchant. The resultant silver is easily adsorbed to an uneven region of a surface of the bonding pattern, resulting in the risk of short circuit of the bonding pattern.

Figure 1:
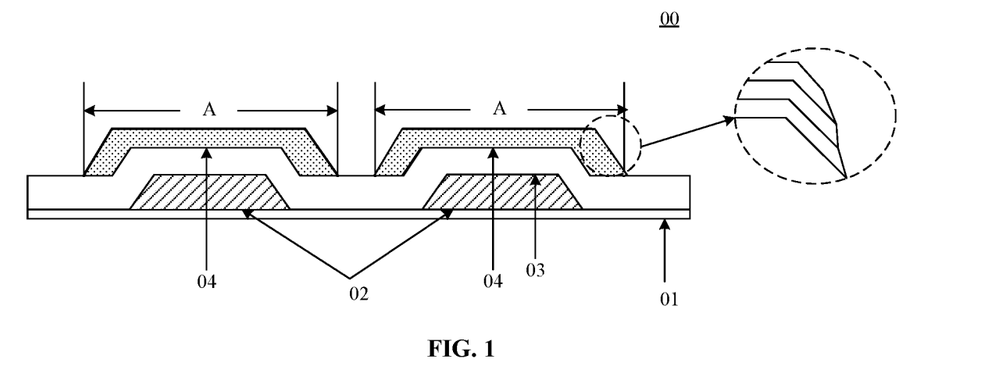
FIG. 1 is a partial structural diagram of a display panel.

FIG. 1 is a partial structural diagram of a display panel. The display panel 00 includes a base substrate 01, a gate pattern 02 formed on the base substrate 01, an interlayer dielectric layer 03 formed on the gate pattern 02, and a bonding pattern 04 formed on the interlayer dielectric layer 03. A dotted circle in FIG. 1 further schematically shows a side surface of a bonding pattern formed by three layers of metal material. A displacement reaction is likely to occur between a metal interlayer exposed from the side surface and an etchant.

For easily lapping the display panel and a circuit board (for example, a printed circuit board), the bonding pattern 04 is usually a plurality of protrusion portions on the base substrate 01. The forming reason of the plurality of protrusion portions may be as follows. The thickness of the interlayer dielectric layer 03 is usually relatively small. Therefore, after the interlayer dielectric layer 03 is covered on a gate layer 02, the interlayer dielectric layer 03 is raised along the contour of the gate pattern 02, such that a surface of the interlayer dielectric layer 03 is provided with a plurality of protrusion regions. Similarly, the thickness of the bonding pattern 04 is also usually relatively thin. Therefore, when the bonding pattern 04 is covered on the interlayer dielectric layer 03, the bonding pattern 04 is raised along the contour of the interlayer dielectric layer 03, such that the eventually formed bonding pattern 04 is a plurality of protrusion portions on the base substrate 01. The plurality of protrusion portions form uneven regions. Displaced metal tends to adhere to the uneven regions. FIG. 1 schematically shows the uneven regions A.

Figure 2:
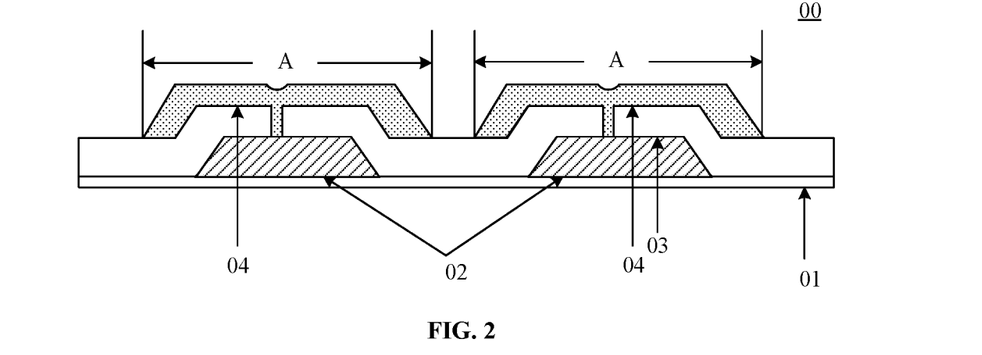
FIG. 2 is a partial structural diagram of another display panel.

FIG. 2 is a partial structural diagram of another display panel provided in the related art. Based on the display panel 00 shown in FIG. 1, in the display panel 00 shown in FIG. 2, a via is provided in the interlayer dielectric layer 03. The via allows the bonding pattern 04 to be electrically connected to the gate layer 02. Because the via is provided in the interlayer dielectric layer 03, during the formation of the bonding pattern 04, a recess region is formed at a position, corresponding to the via, on the bonding pattern 04. The recess region further results in an uneven surface of the bonding pattern 04, and increases the area of an uneven region on the surface of the bonding pattern 04. Displaced metal also tends to adhere to the recess region. As a result, more metal tends to adhere to the uneven region on the surface of the bonding pattern 04.

In addition, metal not only tends to adhere to the uneven region, but also tends to suspend in air to be oxidized to generate metal oxide. If falling on the bonding pattern, the metal oxide tends to affect the conductivity of the bonding pattern. For example, displaced silver is oxidized in air into silver oxide (AgO). If falling on the bonding pattern, the silver oxide tends to affect the conductivity of the bonding pattern.

Figure 3:
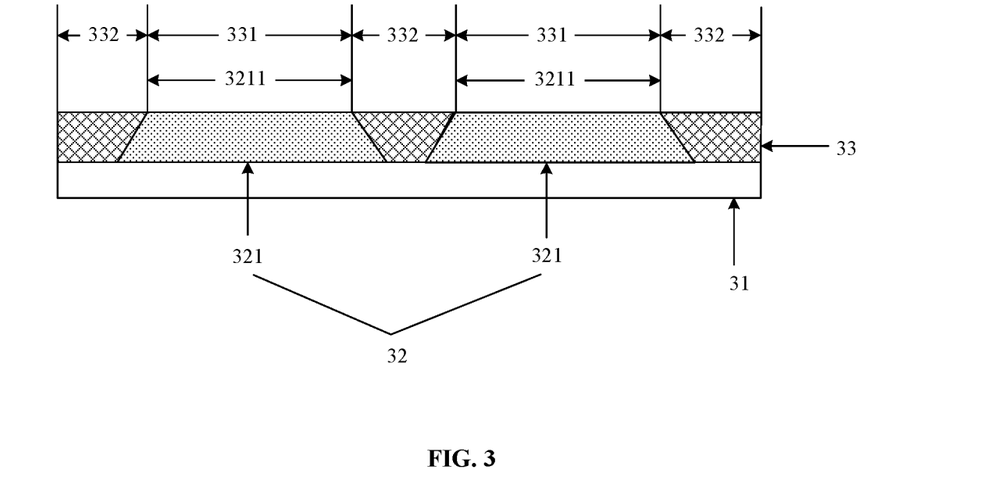
FIG. 3 is a partial structural diagram of a display panel according to an embodiment of the present disclosure.

FIG. 3 is a partial structural diagram of a display panel 30 according to an embodiment of the present disclosure. The display panel 30 includes a base substrate 31, a bonding pattern 32, and a planarization layer pattern 33.

The bonding pattern 32 is formed on the base substrate 31. The bonding pattern 32 includes one or more conductive blocks 321. A bonding region 3211 is disposed on a surface, distal from the base substrate 31, of the conductive block 321. The bonding region 3211 is used for connecting a display panel or a circuit board. The bonding pattern 32 shown in FIG. 3 includes two conductive blocks 321. However, there may be more conductive blocks, which is not limited in the embodiments of the present disclosure.

The planarization layer pattern 33 is formed by processing a planarization layer, which is form on the base substrate 31 where the bonding pattern 32 is formed. The planarization layer pattern 33 is provided with an opening region 331 and an occlusion portion 332 in a plane parallel to the base substrate 31. An orthographic projection of the bonding region 3211 onto the base substrate 31 is within an orthographic projection of the opening region 331 onto the base substrate 31. An orthographic projection of a side surface (the conductive block may be enclosed by two opposed surfaces in a direction perpendicular to the base substrate and a surface connecting the two surfaces, and the surface connecting the two opposed surfaces is the side surface of the conductive block) of the conductive block 321 onto the base substrate 31 is within an orthographic projection of the occlusion portion 332 onto the base substrate 31. That is, the planarization layer pattern 33 covers at least part of the side surface of the conductive block 321. The side surface is a surface, other than a surface proximal to the base substrate 31 and a surface distal from the base substrate 31, of the conductive block.

In summary, for the display panel provided in the embodiments of the present disclosure, because a planarization layer covers part of a side surface of a conductive block in a bonding pattern, a region, exposing an interlayer, on the side surface of the conductive block is reduced, a displacement reaction between an anode etchant and the interlayer is reduced, the risk of short circuit of the bonding pattern due to adherence of displaced metal to the bonding pattern is also lowered, thereby reducing the abnormal display of the display panel.

Figure 4:
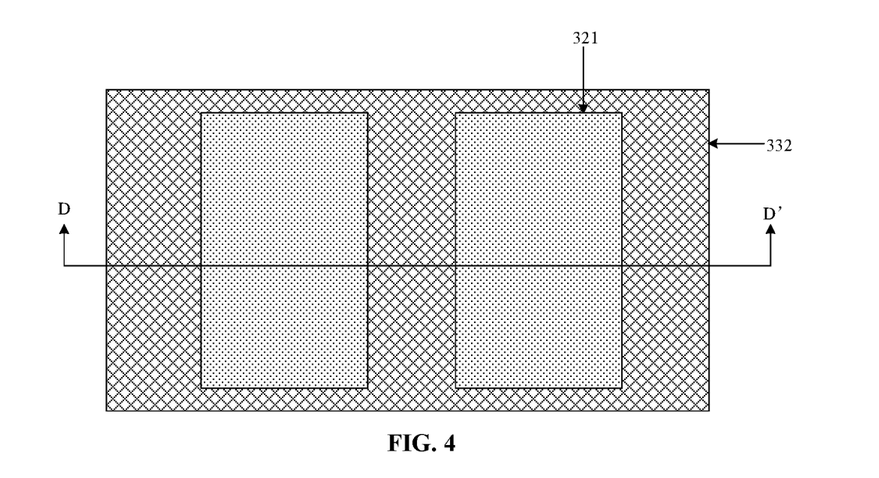
FIG. 4 is a top view of a display panel according to an embodiment of the present disclosure.

FIG. 4 is a top view of the display panel shown in FIG. 3, the display panel shown in FIG. 3 is a cross-sectional view of the display panel shown in FIG. 4 at DD'.

It needs to be noted that in other optional embodiments, the bonding pattern 32 may also be referred to as a chip-on-film (COF) unit (a chip-on-film is a package structure in which a driving integrated circuit is fixed on a flexible circuit board). A plurality of chip-on-film units may form a bonding region. The plurality of chip-on-film units may be disposed on the display panel. The bonding pattern 32 may include a first sub-bonding pattern. FIG. 3 shows the case that the bonding pattern 32 includes the first sub-bonding pattern. The first sub-bonding pattern includes at least one of the one or more conductive blocks 321. The conductive block 321 may also be referred to as a source/drain line (the source/drain line may include a source line or a drain line or include both a source line and a drain line, wherein the source/drain line may be a source/drain metal line). That is, each chip-on-film unit may include the first sub-bonding pattern. The first sub-bonding pattern includes at least one source/drain metal line. Optionally, the planarization layer includes an organic planarization layer. The material forming the planarization layer includes a photoresist. The planarization layer pattern 33 may be formed by exposing and developing the planarization layer through a grayscale mask process.

The grayscale mask process may also be referred to as a half-exposure process. The grayscale mask process may provide different light transmittances at different positions of a mask (also referred as a grayscale mask). After one development, a plurality of photoresist regions with different thicknesses may be formed, such that a plurality of patterns with different thicknesses can be patterned.

In the embodiments of the present disclosure, the grayscale mask may include a first region and a second region. Depending on properties (for example, thicknesses) of photoresists, the first region and the second region may have different light transmittances. For example, the photoresist is a positive photoresist. In the grayscale mask used for exposing the positive photoresist, a light transmittance of the first region is less than a light transmittance of the second region (for example, this can be implemented by making a thickness of the first region greater than the thickness of the second region). The first region corresponds to the occlusion portion 332 of the planarization layer pattern 33. The second region corresponds to a region, other than the occlusion portion 332, on the display panel. The region other than the occlusion portion 332 on the display panel includes the opening region 331 of the planarization layer pattern 33. After one development, the planarization layer pattern 33 may be formed. In other optional embodiments, a conventional mask may be used to form the planarization layer pattern 33, which is not limited in the embodiments of the present disclosure.

Figure 5:
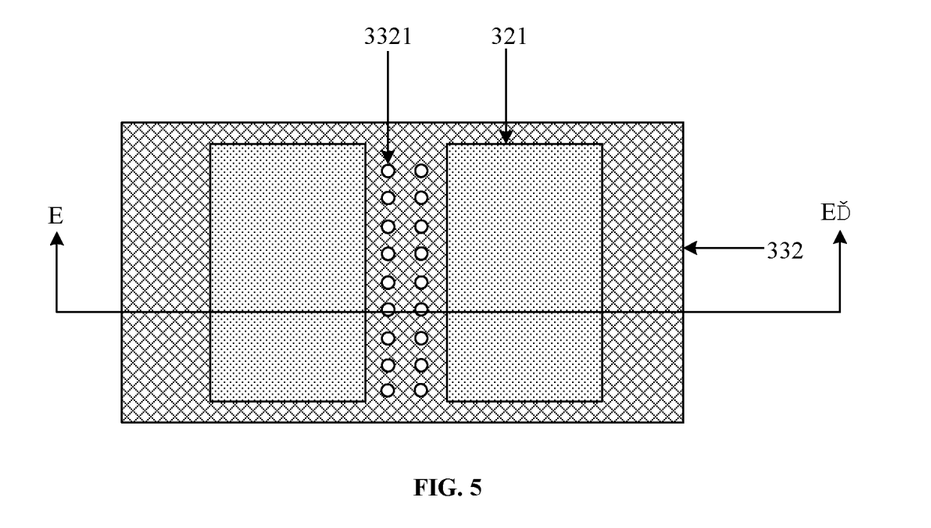
FIG. 5 is a top view of another display panel according to an embodiment of the present disclosure.

Optionally, due to the fluidity of the photoresist, after the display panel stands in a horizontal plane for a period of time, a surface of the occlusion portion 332 may tend to be flat. To ensure that the surface of the occlusion portion 332 becomes flat quickly, as shown in FIG. 5, in a manufacturing process of the display panel, the occlusion portion 332 of the planarization layer pattern (the numeral is not shown in FIG. 4) may be provided with at least one groove 3321. The occlusion portion 332 formed with the groove 3321 has a height difference at each groove 3321. Based on the fluidity of the photoresist, the photoresist at a high position spontaneously flows toward a low position to fill each groove 3321 (It needs to be noted that, a size of the opening region of the planarization layer is usually relatively large, i.e., a size of the opening region is usually far greater than a size of the groove. Therefore, the fluidity of the photoresist does not affect the opening region). In this way, the speed of flattening of the surface of the occlusion portion 332 is increased, thereby effectively reducing the time of a manufacturing process of the display panel. It needs to be noted that, the number of the grooves 3321 in the occlusion portion 332 is proportional to the flatness and the speed of flattening of the surface of the formed occlusion portion 332. That is, the large the number of the grooves 3321 in the occlusion portion 332 is, the flatter the surface of the occlusion portion 332 is, and the higher the speed of flattening of the planarization layer pattern 332 is. The groove may be alternatively a channel. This is not limited in the embodiments of the present disclosure.

Optionally, in the embodiments of the present disclosure, the thickness of the occlusion portion is not less than the thickness of the bonding pattern. In this way, the occlusion portion can cover a region in which an interlayer may be exposed on the side surface of the conductive block. Considering that the bonding pattern 32 is used for connecting the circuit board and the display panel, both the circuit board and the display panel are lapped with the bonding pattern 32 by pins to achieve an electrical connection, to ensure the pin being stably lapped with the bonding pattern 32, the occlusion portion 332 of the planarization layer pattern 33 may be configured to be flush with the bonding pattern 32 ("flush with" may be that a surface, distal from the base substrate, of the occlusion portion of the planarization layer pattern is flush with a surface, distal from the base substrate, of the bonding pattern, and "flush with" may be coplanar), referring to the display panel shown in FIG. 3. Certainly, in other optional embodiments, the occlusion portion 332 of the planarization layer pattern 33 may be alternatively configured to be higher than the bonding pattern 32, such that the occlusion portion 332 can effectively wrap the side surface of the conductive block included in the bonding pattern 32, to prevent the side surface from being corroded by the anode etchant.

It needs to be noted that the occlusion portion 332 of the planarization layer pattern 33 is flush with the bonding pattern 32, which means that a surface, distal from the base substrate, of the occlusion portion 332 after standing on a horizontal plane for a period of time is flush with a surface, distal from the base substrate, of the bonding pattern 32. In this way, the case where the thickness of the occlusion portion 332 of the planarization layer pattern 33 is inconsistent before standing and after standing due to the fluidity of the material forming the planarization layer such that the occlusion portion 332 is eventually not flush with the bonding pattern 32 is avoided.

Figure 6:
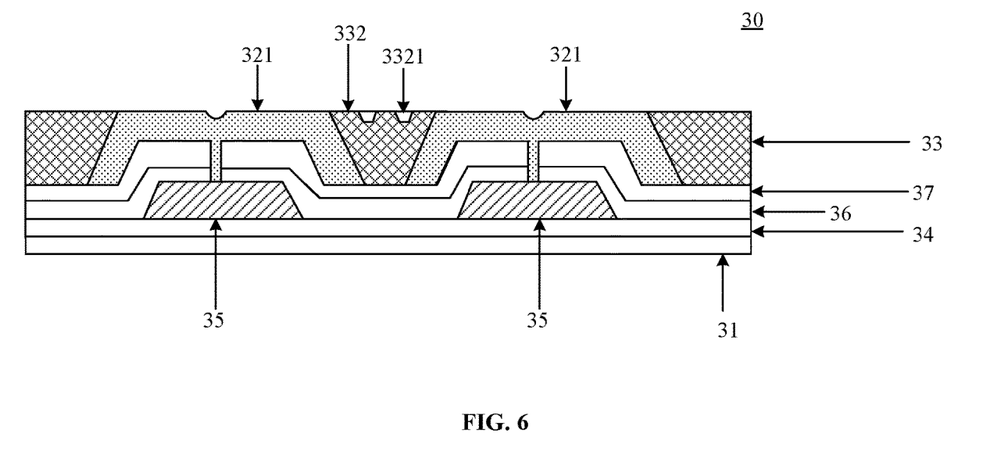
FIG. 6 is a partial structural diagram of another display panel according to an embodiment of the present disclosure.

In other optional embodiments, the bonding pattern may further include a second sub-bonding pattern. That is, the bonding pattern includes the first sub-bonding pattern and the second sub-bonding pattern. In the embodiments of the present disclosure, an example in which the second sub-bonding pattern includes at least one gate pattern and the first sub-bonding pattern includes at least one of the one or more conductive blocks is described. FIG. 6 is a partial structural diagram of another display panel according to an embodiment of the present disclosure. FIG. 6 may be a sectional view of the display panel shown in FIG. 5 at EE'. The display panel 30 includes a first gate insulating layer 34 formed on the base substrate, at least one gate pattern 35 (two gate patterns 35 are used as an example in FIG. 6 for description) formed on the base substrate 31 where the first gate insulating layer 34 is formed, a second gate insulating layer 36 formed on the base substrate 31 where the gate pattern 35 is formed, an interlayer dielectric layer 37 formed on the base substrate 31 where the second gate insulating layer 36 is formed, and one or more conductive blocks 321 (two conductive blocks 321 are used as an example in FIG. 6 for description) formed on the base substrate where the interlayer dielectric layer 37 is formed. In addition, in the occlusion portion 332 of the planarization layer pattern 33 of the display panel 30, a plurality of grooves 3321 are disposed. It needs to be noted that, FIG. 6 shows the case where the interlayer dielectric layer 37 and the second gate insulating layer 36 are each provided with a via. The at least one gate pattern 35 corresponds to the one or more conductive blocks 321 one to one and are electrically connected to the one or more conductive blocks 321 by the via provided in each of the interlayer dielectric layer 37 and the second gate insulating layer 36.

In the embodiment shown in FIG. 6, the bonding pattern 32 not only includes the one or more conductive blocks 321, but also includes the at least one gate pattern 35 that is connected to the conductive block in one-to-one correspondence. One conductive block 321 and one corresponding gate pattern 35 may be used for forming a chip-on-film pad. One chip-on-film pad may be referred to as one bonding pattern 32.

Figure 7:
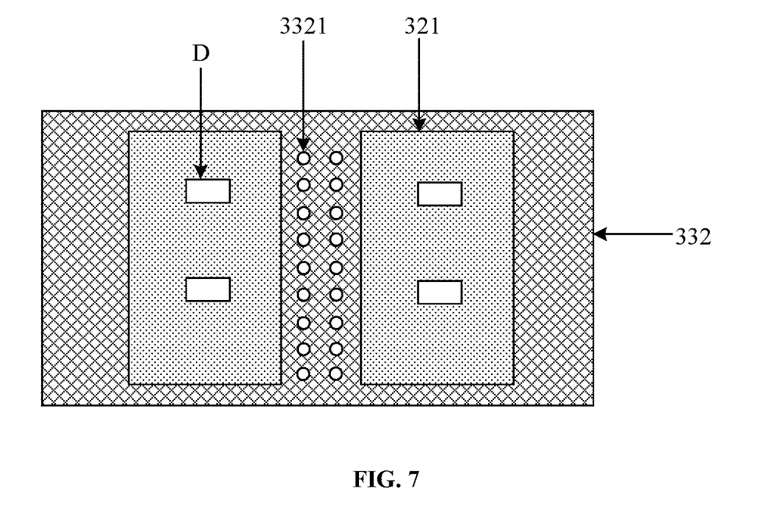
FIG. 7 is a schematic structural diagram of another display panel according to an embodiment of the present disclosure.

FIG. 7 is a top sectional view of the display panel shown in FIG. 6 (the section may be a surface parallel to the base substrate and intersecting with the via), and is a schematic diagram showing that the at least one groove 3321 is formed in the occlusion portion 332 of the display panel shown in FIG. 6. As can be seen from FIG. 7, the one or more conductive blocks 321 are provided with a plurality of vias D for connecting the first sub-bonding pattern and the second sub-bonding pattern.

Figure 8:
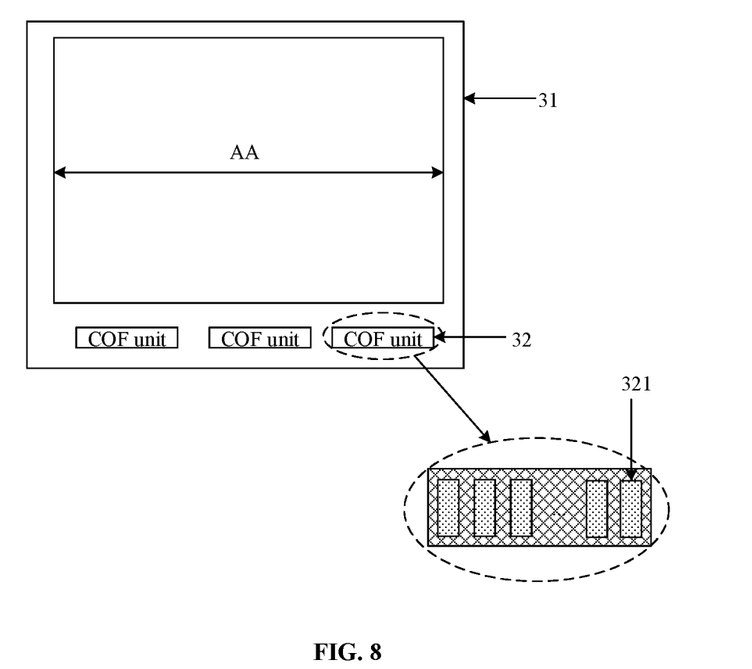
FIG. 8 is a schematic structural diagram of another display panel according to an embodiment of the present disclosure.

FIG. 8 schematically shows a schematic structural diagram of a display panel. The display panel includes an active area (AA) and three chip-on-film units (that is, three bonding patterns 32). Each chip-on-film unit includes at least one chip-on-film pad (that is, including one or more conductive blocks 321 and at least one corresponding gate pattern). The active area and the three chip-on-film units (that is, the bonding patterns) are all disposed on the base substrate 31. The base substrate 31 may be thin film transistor (TFT) glass. The thin film transistor glass may also be referred to as liquid crystal glass, or electrically-controlled liquid crystal glass, or the like.

Optionally, a thickness of the occlusion portion of the planarization layer pattern 33 may range from 6500 angstroms to 8800 angstroms. For example, a thickness of the occlusion portion of the planarization layer pattern 33 is 8800 angstroms. Still referring to FIG. 6, it is assumed that the thickness of the second gate insulating layer 36 in the figure is 1300 angstroms, the thickness of the interlayer dielectric layer 37 is 5000 angstroms, the thickness of each gate pattern 35 is 2500 angstroms, and the thickness of each conductive block 321 is 6300 angstroms. When the thickness of the occlusion portion of the planarization layer pattern 33 is 8800 angstroms, the occlusion portion of the planarization layer pattern 33 may fill a level difference between the conductive block 321 and the interlayer dielectric layer 37, such that gaps between the conductive block 321 and the conductive block 321 may be flattened, thereby avoiding exposing an interlayer from a side surface of the conductive block, and causing a circuit board and the display panel to be stably lapped with the bonding pattern 32 by a pin, thus ensuring a normal display effect of the display panel.

In summary, for the display panel provided in the embodiments of the present disclosure, because a planarization layer covers a side surface of a conductive block in a bonding pattern, a region, exposing an interlayer, on the side surface of the conductive block is prevented from contacting the outside, a displacement reaction between an anode etchant and the interlayer is avoided, the risk of short circuit of the bonding pattern due to adherence of displaced metal to the bonding pattern is also avoided, and the abnormal display of the display panel is further avoided. In addition, the occlusion portion of the planarization layer pattern is configured to be flush with the bonding pattern, such that a circuit board and the display panel may be stably lapped with the bonding pattern, to avoid pin breakage, and prevent abnormal display of the display panel to some extent.

Figure 9:
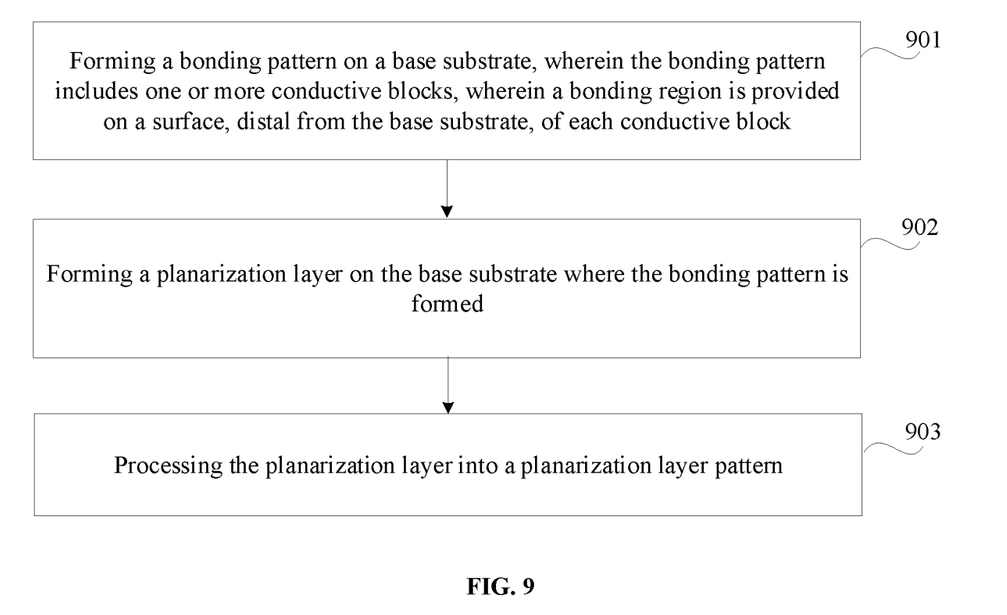
FIG. 9 is a flowchart of a manufacturing method of a display panel according to an embodiment of the present disclosure.

FIG. 9 is a flowchart of a manufacturing method of a display panel according to an embodiment of the present disclosure. The method may be used for manufacturing the display panel shown in FIG. 3. The method includes the following steps.

In step 901, a bonding pattern is formed on a base substrate, wherein the bonding pattern includes one or more conductive blocks, wherein a surface, distal from the base substrate, of each conductive block is provided with a bonding region.

In step 902, a planarization layer is formed on the base substrate where the bonding pattern is formed.

In step 903, the planarization layer is processed into a planarization layer pattern.

The planarization layer pattern is provided with an opening region and an occlusion portion in a plane parallel to the base substrate. An orthographic projection of the bonding region onto the base substrate is within an orthographic projection of the opening region onto the base substrate. The planarization layer pattern covers at least part of a side surface of the conductive block. The side surface is a surface, other than a surface proximal to the base substrate and a surface distal from the base substrate, of the conductive block. Optionally, the planarization layer pattern covers the entire side surface of the conductive block.

In summary, for the manufacturing method of a display panel provided in the embodiments of the present disclosure, because a planarization layer covers part of a side surface of a conductive block in a bonding pattern, a region, exposing an interlayer, on the side surface of the conductive block is reduced, a displacement reaction between an anode etchant and the interlayer is reduced, the risk of short circuit of the bonding pattern due to adherence of displaced metal to the bonding pattern is also decreased, and the abnormal display of the display panel is further avoided.

Optionally, the bonding pattern may include a first sub-bonding pattern, wherein the first sub-bonding pattern includes at least one of the one or more conductive blocks. For the manufacturing method of the display panel, reference may be made to the embodiment shown in FIG. 9.

Figure 10:
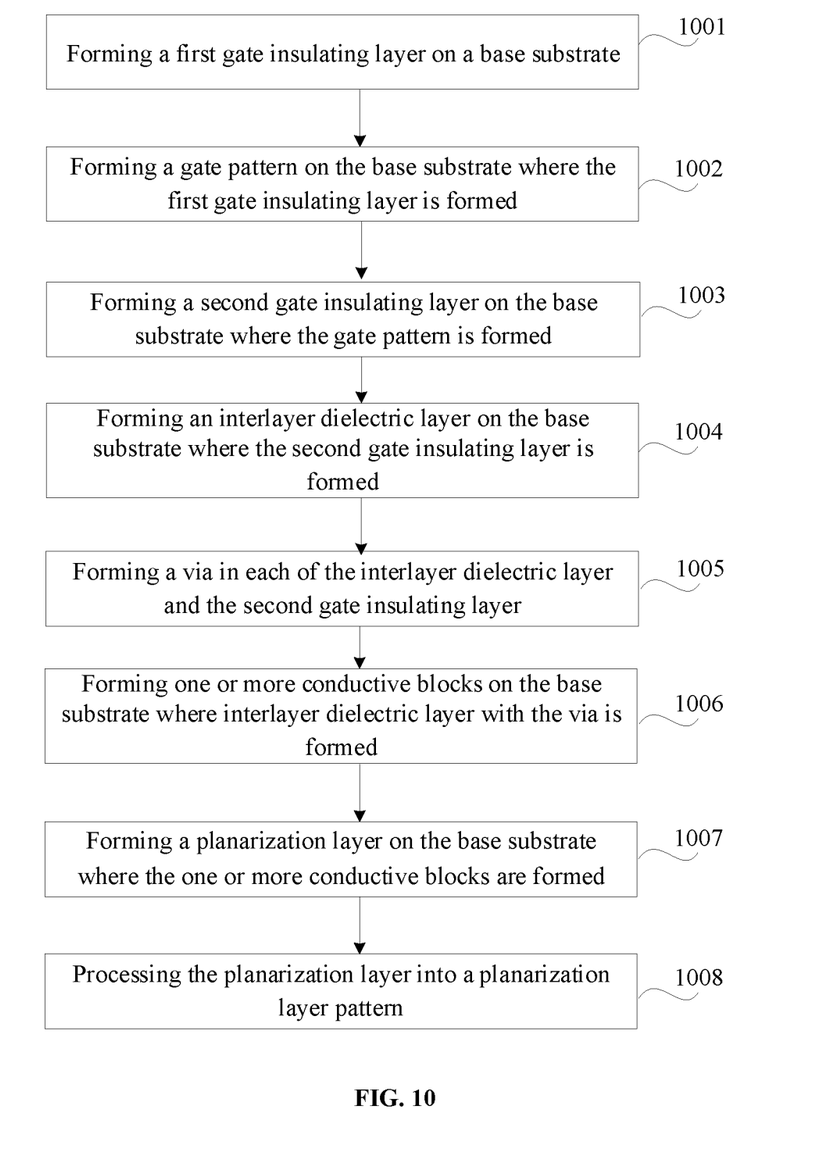
FIG. 10 is a flowchart of another manufacturing method of a display panel according to an embodiment of the present disclosure.

Optionally, the bonding pattern may further include a second sub-bonding pattern. That is, the bonding pattern includes the first sub-bonding pattern and the second sub-bonding pattern. In the embodiments of the present disclosure, an example in which the second sub-bonding pattern includes at least one gate pattern, the first sub-bonding pattern includes at least one of the one or more conductive blocks, a first insulating layer includes a first gate insulating layer, and a second insulating layer includes a second gate insulating layer is used for description. FIG. 10 is a flowchart of another manufacturing method of a display panel according to an embodiment of the present disclosure. The method may be used for forming the display panel shown in FIG. 7. The method includes the following steps.

In step 1001, a first gate insulating layer is formed on a base substrate.

Optionally, the first gate insulating layer is formed on the base substrate by coating, etc. The first gate insulating layer can be arranged in a same layer as a first gate insulating layer formed in an active area.

In step 1002, a gate pattern is formed on the base substrate where the first gate insulating layer is formed.

Optionally, a gate layer formed on the base substrate is processed by a patterning process to form at least one gate pattern. The at least one gate pattern and the gate pattern of each pixel in the active area may be disposed in the same layer, and can be formed by using one patterning process. In the embodiments of the present disclosure, the patterning process may include steps such as coating photoresist, exposing, developing, etching, or stripping photoresist.

In step 1003, a second gate insulating layer is formed on the base substrate where the gate pattern is formed.

Optionally, the second gate insulating layer is formed on the base substrate by coating, etc. The second gate insulating layer can be arranged in a same layer as the second gate insulating layer formed in the active layer. That is, the second gate insulating layer can be formed at the same time as the second gate insulating layer formed in the active layer.

In step 1004, an interlayer dielectric layer is formed on the base substrate where the second gate insulating layer is formed.

Optionally, the interlayer dielectric layer is formed on the base substrate where the second gate insulating layer is formed by coating, etc. The interlayer dielectric layer can be arranged in a same layer as the interlayer dielectric layer formed in the active area. The interlayer dielectric layer and the interlayer dielectric layer formed in the active area may be formed at the same time.

In step 1005, a via is formed in each of the interlayer dielectric layer and the second gate insulating layer.

There may be a plurality of vias.

In step 1006, one or more conductive blocks are formed on the base substrate where the interlayer dielectric layer with the via is formed.

Each conductive block in the one or more conductive blocks may be connected to the corresponding gate pattern by one via. Optionally, the one or more conductive blocks are formed on the base substrate where the interlayer dielectric layer is formed by a patterning process. The one or more conductive blocks and a source/drain metal pattern of each pixel in the active area may be disposed in the same layer, and can be formed by using one patterning process. A bonding pattern includes one or more conductive blocks, wherein a surface, distal from the base substrate, of each conductive block is provided with a bonding region.

In step 1007, a planarization layer is formed on the base substrate where the one or more conductive blocks are formed.

Optionally, the planarization layer is formed on the base substrate by coating, etc. The planarization layer can be arranged in a same layer as the planarization layer formed in the active area.

In step 1008, the planarization layer is processed into a planarization layer pattern.

The planarization layer pattern is provided with an opening region and an occlusion portion in a plane parallel to the base substrate. An orthographic projection of the bonding region onto the base substrate is within an orthographic projection of the opening region onto the base substrate. The planarization layer pattern covers at least part of a side surface of the conductive block. The side surface is a surface, other than a surface proximal to the base substrate and a surface distal from the base substrate, of the conductive block. Optionally, the planarization layer pattern covers the entire side surface of the conductive block.

Optionally, step 1008 may include: processing the planarization layer into the planarization layer pattern by a grayscale mask process. The occlusion portion of the planarization layer pattern is flush with the bonding pattern. When the bonding pattern includes a first sub-bonding pattern and a second sub-bonding pattern, the occlusion portion is flush with an outer surface of a layer of sub-bonding pattern, distal from the base substrate, of the bonding pattern. For related descriptions of that the occlusion portion of the planarization layer pattern is flush with the bonding pattern, reference may be made to the foregoing device side embodiment. Details are not described herein again.

Optionally, step 1008 may include: forming the planarization layer pattern including the at least one groove by exposing and developing the planarization layer using a designated mask as a mask. Optionally, the designated mask may be a grayscale mask described above or other mask which is not limited in the embodiments of the present disclosure. The designated mask may include a first region, a second region, and a grayscale mask region. The first region surrounds the grayscale mask region. The first region may correspond to the occlusion portion. The second region may correspond to the opening region. The grayscale mask region may correspond to the at least one groove. After the planarization layer is exposed and developed using the designated mask, the planarization layer pattern may be formed. The planarization layer pattern includes the opening region and the occlusion portion. The at least one groove is further formed in the occlusion portion. For descriptions related to the groove, reference may be made to the foregoing device side embodiment. Details are not described herein again.

The designated mask may be alternatively a conventional mask (that is, a binary mask). The planarization layer can be processed into the planarization layer pattern by a conventional mask process. The conventional mask may have a region corresponding to the at least one groove, to form the at least one groove in the occlusion portion. This is not limited in the embodiments of the present disclosure.

Optionally, the thickness of the occlusion portion of the planarization layer pattern is 8800 angstroms.

In summary, for the manufacturing method of a display panel provided in the embodiments of the present disclosure, because a planarization layer covers a side surface of a conductive block in a bonding pattern, a region, exposing an interlayer, on the side surface of the conductive block is prevented from contacting the outside, a displacement reaction between an anode etchant and the interlayer is avoided, the risk of short circuit of the bonding pattern due to adherence of the displaced metal to the bonding pattern is also decreased, thus the abnormal display of the display panel is further avoided. In addition, an occlusion portion of the planarization layer pattern is configured to be flush with the bonding pattern, such that a circuit board and the display panel may be stably lapped with the bonding pattern, thus preventing a pin breakage, and avoiding the abnormal display of the display panel to some extent.

An embodiment of the present disclosure further provides a display device. The display device includes the display panel provided in the foregoing embodiment. The display device may be electronic paper, a mobile phone, a tablet computer, a television, a display, a notebook computer, a digital frame, a navigator or any other product or component having a display function.

The foregoing optional technical solutions may be arbitrarily combined to derive optional embodiments of the present disclosure. Details are not described herein one by one again.

Described above are merely exemplary embodiments of the present disclosure, and are not intended to limit the present disclosure. Within the spirit and principles of the disclosure, any modifications, equivalent substitutions, improvements, and the like are within the protection scope of the present disclosure.

What is claimed is:

1. A display panel comprising a base substrate, a bonding pattern, and a planarization layer pattern; wherein
the bonding pattern is disposed on the base substrate, and the bonding pattern comprises one or more conductive blocks, wherein a bonding region is disposed on a surface, distal from the base substrate, of the conductive block;
the planarization layer pattern is provided with an opening region and an occlusion portion in a plane parallel to the base substrate, wherein an orthographic projection of the bonding region onto the base substrate is within an orthographic projection of the opening region onto the base substrate;
the planarization layer pattern covers at least part of a side surface of the conductive block, wherein the side surface is a surface, other than a surface proximal to the base substrate and a surface distal from the base substrate, of the conductive block.

2. The display panel according to claim 1, wherein
the bonding pattern comprises a first sub-bonding pattern and a second sub-bonding pattern, wherein the first sub-bonding pattern comprises at least one of the one or more conductive blocks; and
the display panel comprises a first insulating layer, a second insulating layer, and an interlayer dielectric layer, wherein the first insulating layer, the second sub-bonding pattern, the second insulating layer, the interlayer dielectric layer, and the first sub-bonding pattern are sequentially disposed on the base substrate.

3. The display panel according to claim 2, wherein the conductive block comprises a source/drain line.

4. The display panel according to claim 2, wherein the second sub-bonding pattern comprises a gate pattern.

5. The display panel according to claim 2, wherein the interlayer dielectric layer and the second insulating layer are each provided with a via, and the first sub-bonding pattern is electrically connected to the second sub-bonding pattern by the via.

6. The display panel according to claim 1, wherein a surface, distal from the base substrate, of the occlusion portion of the planarization layer pattern is flush with a surface, distal from the base substrate, of the bonding pattern.

7. The display panel according to claim 1, wherein a thickness of the occlusion portion of the planarization layer pattern ranges from 6500 angstroms to 8800 angstroms.

8. The display panel according to claim 1, wherein the occlusion portion of the planarization layer pattern is provided with at least one groove.

9. The display panel according to claim 1, wherein
a surface, distal from the base substrate, of the occlusion portion of the planarization layer pattern is flush with a surface, distal from the base substrate, of the bonding pattern;
the bonding pattern comprises a first sub-bonding pattern and a second sub-bonding pattern, wherein the first sub-bonding pattern comprises at least one of the one or more conductive blocks;
the display panel comprises a first insulating layer, a second insulating layer, and an interlayer dielectric layer, wherein the first insulating layer, the second sub-bonding pattern, the second insulating layer, the interlayer dielectric layer, and the first sub-bonding pattern are sequentially disposed on the base substrate;
the conductive block comprises a source/drain line;
the second sub-bonding pattern comprises a gate pattern; and
the interlayer dielectric layer and the second insulating layer are each provided with a via, wherein the first sub-bonding pattern is electrically connected to the second sub-bonding pattern by the via.

10. A method for manufacturing a display panel, comprising:
forming a bonding pattern on a base substrate, wherein the bonding pattern comprises one or more conductive blocks, wherein a surface, distal from the base substrate, of each of the one or more conductive blocks is provided with a bonding region;
forming a planarization layer on the base substrate where the bonding pattern is formed; and
processing the planarization layer into a planarization layer pattern, wherein the planarization layer pattern is provided with an opening region and an occlusion portion in a plane parallel to the base substrate, an orthographic projection of the bonding region onto the base substrate is within an orthographic projection of the opening region onto the base substrate, and the planarization layer pattern covers at least part of a side surface of the conductive block, wherein the side surface is a surface, other than a surface proximal to the base substrate and a surface distal from the base substrate, of the conductive block.

11. The method according to claim 10, wherein
a material of the planarization layer comprises a photoresist; and
processing the planarization layer into the planarization layer pattern comprises:
processing the planarization layer into a planarization layer pattern comprising at least one groove, wherein the at least one groove is disposed in the occlusion portion of the planarization layer pattern.

12. The method according to claim 11, wherein processing the planarization layer into the planarization layer pattern comprising the at least one groove comprises:
forming the planarization layer pattern comprising the at least one groove by exposing and developing the planarization layer using a designated mask as a mask, wherein the designated mask comprises a grayscale mask region corresponding to the groove.

13. The method according to claim 12, wherein the designated mask comprises a first region and a second region, wherein the first region corresponds to the occlusion portion, and the second region corresponds to the opening region.

14. The method according to claim 10, wherein processing the planarization layer into a planarization layer pattern comprises:
processing the planarization layer into the planarization layer pattern by a grayscale mask process, wherein a surface, distal from the base substrate, of the occlusion portion of the planarization layer pattern is flush with a surface, distal from the base substrate, of the bonding pattern.

15. The method according to claim 10, wherein the bonding pattern comprises a first sub-bonding pattern and a second sub-bonding pattern; and forming the bonding pattern on the base substrate comprises:
forming a first insulating layer on the base substrate;
forming the second sub-bonding pattern on the base substrate where the first insulating layer is formed;

forming a second insulating layer on the base substrate where the second sub-bonding pattern is formed;

forming an interlayer dielectric layer on the base substrate where the second insulating layer is formed; and forming the first sub-bonding pattern on the base substrate where the interlayer dielectric layer is formed, wherein the first sub-bonding pattern comprises at least one of the one or more conductive blocks.

16. The method according to claim 15, wherein before forming the first sub-bonding pattern on the base substrate where the interlayer dielectric layer is formed, the method comprises:

forming a via in each of the interlayer dielectric layer and the second insulating layer; and forming the first sub-bonding pattern on the base substrate where the interlayer dielectric layer is formed comprises:

forming the first sub-bonding pattern on the base substrate where the interlayer dielectric layer with the via is formed, wherein the first sub-bonding pattern is connected to the second sub-bonding pattern by the via in the interlayer dielectric layer and the second insulating layer.

17. The method according to claim 15, wherein the conductive block comprises a source/drain line, and the second sub-bonding pattern comprises a gate pattern.

18. The method according to claim 10, wherein a thickness of the occlusion portion of the planarization layer pattern ranges from 6500 angstroms to 8800 angstroms.

19. The method according to claim 10, wherein a material of the planarization layer comprises a photoresist, and processing the planarization layer into the planarization layer pattern comprises:

forming a planarization layer pattern comprising at least one groove by exposing and developing the planarization layer using a designated mask as a mask, wherein the designated mask comprises a grayscale mask region, a first region, and a second region, wherein the grayscale mask region corresponds to the groove, the first region corresponds to the occlusion portion, and the second region corresponds to the opening region; and the bonding pattern comprises a first sub-bonding pattern and a second sub-bonding pattern, and forming the bonding pattern on the base substrate comprises:

forming a first insulating layer on the base substrate;

forming the second sub-bonding pattern on the base substrate where the first insulating layer is formed;

forming a second insulating layer on the base substrate where the second sub-bonding pattern is formed;

forming an interlayer dielectric layer on the base substrate where the second insulating layer is formed; and forming the first sub-bonding pattern on the base substrate where the interlayer dielectric layer is formed, wherein the first sub-bonding pattern comprises at least one of the one or more conductive blocks.

20. A display device, comprising a display panel, wherein the display panel comprises a base substrate, a bonding pattern, and a planarization layer pattern; wherein the bonding pattern is disposed on the base substrate, and the bonding pattern comprises one or more conductive blocks, wherein a bonding region is disposed on a surface, distal from the base substrate, of the conductive block;

the planarization layer pattern is provided with an opening region and an occlusion portion in a plane parallel to the base substrate, wherein an orthographic projection of the bonding region onto the base substrate is within an orthographic projection of the opening region onto the base substrate;

the planarization layer pattern covers at least part of a side surface of the conductive block, wherein the side surface is a surface, other than a surface proximal to the base substrate and a surface distal from the base substrate, of the conductive block.

* * * * *